US010643684B1

(12) United States Patent
Yang

(10) Patent No.: US 10,643,684 B1
(45) Date of Patent: May 5, 2020

(54) DOUBLE SENSE PROGRAM VERIFICATION OF A MEMORY ARRAY

(71) Applicant: SanDisk Technologies LLC, Addison, TX (US)

(72) Inventor: Xiang Yang, Santa Clara, CA (US)

(73) Assignee: SanDisk Technologies LLC, Addison, TX (US)

(*) Notice: Subject to any disclaimer, the term of this patent is extended or adjusted under 35 U.S.C. 154(b) by 0 days.

(21) Appl. No.: 16/352,697

(22) Filed: Mar. 13, 2019

(51) Int. Cl.
*G11C 11/34* (2006.01)
*G11C 16/04* (2006.01)
*G11C 16/34* (2006.01)
*G11C 29/02* (2006.01)

(52) U.S. Cl.
CPC .............. *G11C 11/34* (2013.01); *G11C 16/04* (2013.01); *G11C 16/3463* (2013.01); *G11C 16/3495* (2013.01); *G11C 29/025* (2013.01)

(58) Field of Classification Search
CPC ..... G11C 11/34; G11C 16/04; G11C 16/3495; G11C 29/025; G11C 16/3463
See application file for complete search history.

(56) References Cited

U.S. PATENT DOCUMENTS 7,020,026 B2 * 3/2006 Guterman .............. G11C 16/30
365/185.17
7,505,321 B2 * 3/2009 Scheuerlein ....... G11C 16/0483
365/185.11

* cited by examiner

*Primary Examiner* — Ajay Ojha
(74) *Attorney, Agent, or Firm* — Rowan TELS LLC

(57) ABSTRACT

A memory controller executes a non-homogeneous bitline biasing program verify operation on bitlines of a memory array, and a homogeneous bitline biasing program verify operation on the bitlines. A count of bitlines responding in a particular way to each type of biasing is used to ascertain the integrity of the memory array.

20 Claims, 9 Drawing Sheets

DOUBLE SENSE PROGRAM VERIFICATION OF A MEMORY ARRAY

BACKGROUND

Modern memory devices push the limits of fabrication technology by packing memory cells into smaller and smaller areas. The density of memory cells in a memory device may become so dense that electron leakage contributes to memory failure.

One issue with memory devices that are high density is they often have one or more fabrication joints in the memory array. These fabrication joints allow for higher density arrays of memory cells, and thus higher capacity memory devices. Unfortunately the presence of a fabrication joint can lead to problems.

One known issue is that the fabrication joint may leak charge between adjacent memory strings in a high-density memory cell array, especially in the presence of fabrication errors. Memory strings are also referred to herein as 'memory channels'. This leakage can lead to programming difficulties and/or inaccurate results when the memory is programmed or read.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
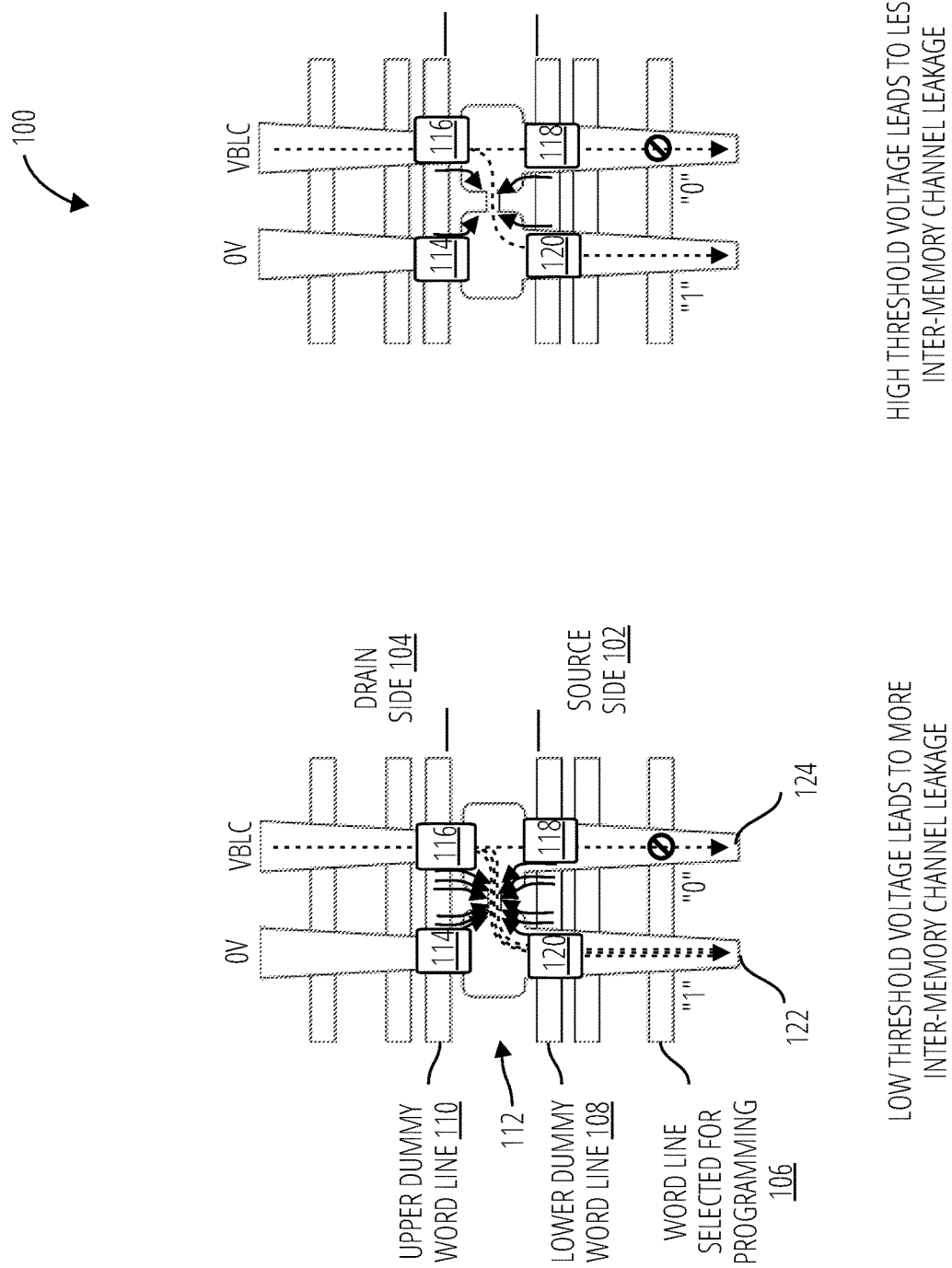
FIG. 1 illustrates a memory channels 100 in accordance with one embodiment.

Disclosed herein are embodiments of in-flight joint-joint leakage detection mechanisms built within a memory cell programming process of the memory device. The memory device may include a memory array with a fabrication joint. A "fabrication joint" is an area along a memory channel configured to electrically and physically couple one part of the memory channel to either another part of the memory channel, a part of another memory channel, and/or another component in a non-volatile memory structure. In certain example embodiments, a fabrication joint electrically and physically connects two ends of two different memory channels, each fabricated at different stages in a fabrication process. A dummy word line is a word line coupled to memory cells that don't store data bits (dummy memory cells). A memory channel is a path for charge flow formed by transistor devices in series. In certain embodiments a memory channel electrically couples a bitline and a source line in a memory device, as illustrated and discussed in more detail to follow.

An additional program verify process may be added to conventional memory cell programming mechanisms with different bitline bias configurations for one particular word line (e.g. WL0) of a memory array. A number (N1) of "non-conducting" cells may be counted under non-homogeneous bitline bias (e.g., bias all bitlines to VBLC) and compared to a count (N2) made for the bitlines under selective (homogeneous) bitline bias (e.g., bias only 0 state bitlines to VBLC and grounding all 1 state bitlines). Herein, the term "0 state" refers to memory cells in a programmed state, and "1 state" refers to memory cells in an erased state.

The detection of joint-joint leakage may be implemented after regular programming concludes on a particular word line, e.g., word line 0. The last operation of regular programming may be the conventional program verification, where only 0 state bitlines may be selectively charged to VBLC, while 1 state bitlines may be grounded (e.g., to true electrical ground). An extra program verification may be introduced in which all bitlines may be biased to a particular value, e.g., VBLC, irrespective of their state.

A difference (or other comparison) may be determined between the number of non-conducting cells for each program verify type, e.g., $\Delta N = abs(N2 - N1)$. If $\Delta N$ or another comparison satisfies (e.g., is less than) a specific threshold, very few joints exhibit joint-joint leakage, so the block may be considered healthy (good block). If $\Delta N$ does not satisfy the threshold, too many joints are exhibiting joint-joint leakage, and the block may be repaired or retired (grown bad block or "GBB").

In an alternate embodiment, two thresholds may be recognized, for example as follows. When $\Delta N <$ Threshold(1), the block may be considered healthy. When Threshold $1 \leq \Delta N \leq$ Threshold 2, the block may be considered reparable. When $\Delta N \geq$ Threshold 2, however, the block may not be reparable, and may need to be retired completely.

FIG. 1 depicts an example of inter-memory-channel leakage current for two different states of adjacent memory channels 100 in a memory array. One memory channel 122 has a channel bias of 0V and the other memory channel 124 has a channel bias of VBLC, e.g., ~0.3V. Due to a fabrication error the two memory channels are (weakly) electrically coupled to one another. The potential gradient between the channels causes current (dashed line) to leak from the channel of the memory channel 124 to the channel of the memory channel 122. The leakage occurs in the fabrication joint 112 between the upper dummy word line 110 on a drain side 104 of the memory array, and the lower dummy word line 108 on a source side 102 of the memory array. Due to the leakage current, the sensing circuits for the memory channels detect the wrong programmed threshold voltages on the memory cells of the word line selected for programming 106 during program verify. This can lead to programming failures or read failures for any memory cells on the source side 102 of memory channels affected by the inter-memory-channel leakage current.

The upper dummy word line 110 comprises dummy memory cell 114 and dummy memory cell 116. The lower dummy word line 108 comprises dummy memory cell 118 and dummy memory cell 120. The inter-memory-channel leakage current may be substantially mitigated by raising the threshold voltage of one or more of these memory cells, as explained in more detail below.

Figure 2:
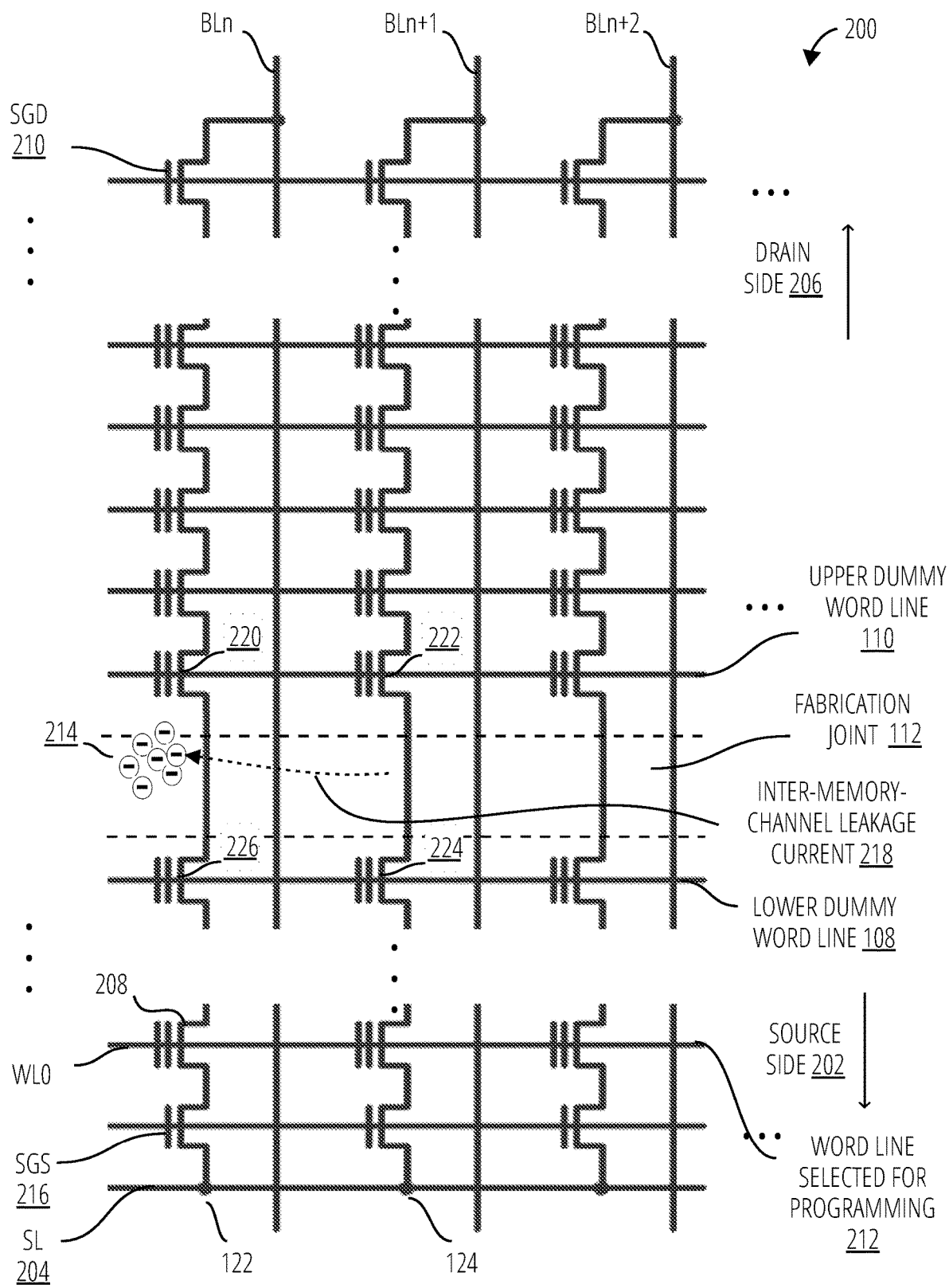
FIG. 2 illustrates a FLASH memory array 200 in accordance with one embodiment.

FIG. 2 depicts a currently programmed memory cell 208, i.e. a memory cell in the process of being programmed, in a FLASH memory array 200. Various known features are depicted, such as bitlines (Blnx), source line 204, and control gates (drain side select gate 210 and source side select gate 216). The memory channel 122 coupled to bit line Bln is uninhibited, and the currently programmed memory cell 208 is coupled to the word line selected for programming 212, e.g., WL0. The memory channels coupled to bit lines Bln+1 and Bln+2 etc. are inhibited. Memory cells on the source side 202 are in whatever state they were programmed into previously. Memory cells on the drain side 206 are still in the erased (Er) state. In this example, each of the dummy memory cell 220, dummy memory cell 222, dummy memory cell 224, and dummy memory cell 226 are programmed in a low-threshold voltage state. The potential gradient between the memory channels of BLn+1 and BLn results in charge migration 214 and an inter-memory-channel leakage current 218. This may disrupt the programming of memory cells on the source side 202.

Figure 3:
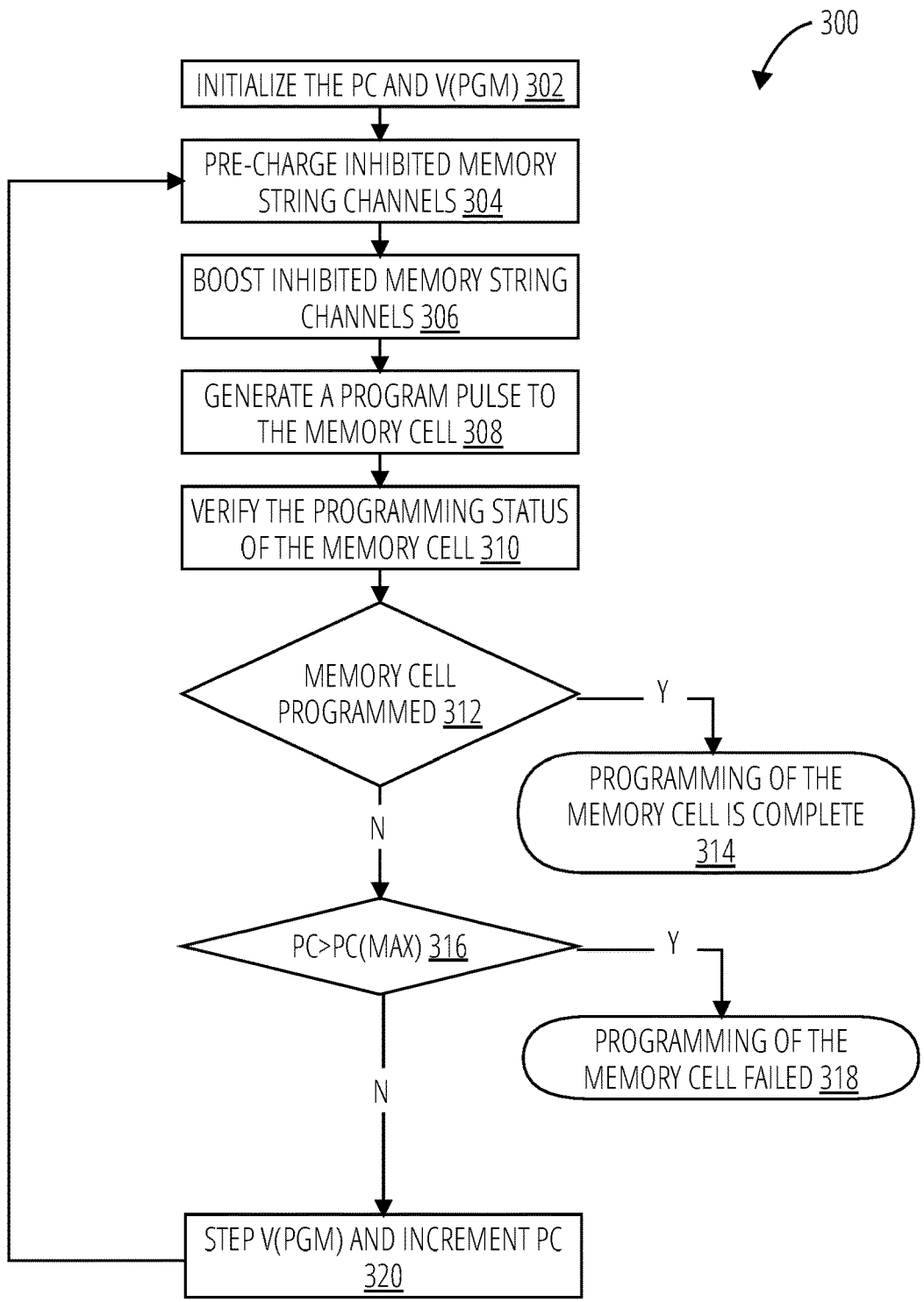
FIG. 3 illustrates a memory cell programming process 300 in accordance with one embodiment.

FIG. 3 is a flowchart illustrating one embodiment of a memory cell programming process 300. The memory cell programming process 300 may be performed by a controller, such as a controller found in a solid state drive (SSD). At block 302, the PROGRAM voltage (Vpgm) and program counter (PC) are set to initial values. V(pgm) is the PROGRAM voltage that will be applied to the selected word line for the first iteration of the memory cell programming process 300. This PROGRAM voltage may be stepped up iteratively during the process. The program counter tracks how many program pulses have been applied, such that programming can be canceled if the memory cell does not program within an allowed number of program pulses.

In one embodiment, an initial value for boosting voltages are also established at block 302. The value of boosting voltages may depend on the magnitude of the PROGRAM voltage. For example, as the PROGRAM voltage increases in magnitude during the process, the magnitude of boosting voltages can also be stepped up.

The value of boosting voltages may depend on the location of the word line relative to the word line selected for programming. Depending on the implementation, the magnitude of the boosting voltage (on any given program loop) for drain side word lines is smaller, larger, or the same as the boosting voltage for source side word lines. Also, in some implementations, using a slightly greater magnitude boosting voltage on word lines near the selected one can help to reduce the potential gradient in the memory string channel near the selected word line, and thus reduce the incidence of hot electrons in the channel.

At block 304, channels of program inhibited memory strings are pre-charged. This is referred to herein as a pre-charge phase. The pre-charge phase may involve establishing one or more pre-charge voltages in the channel of program inhibited memory strings. The magnitude of the pre-charge voltage is not typically uniform throughout the channel from the source line to the bit line. The pre-charge phase may thus result in a potential gradient in a program inhibited memory string channel near the word line that is selected for programming.

At block 306, the voltage in channels of program inhibited memory strings is boosted (this may simply be referred to as "channel boosting"). A program inhibited memory string is one that does not have a memory cell being programmed. That is, the program pulse to be applied to the selected word line should not alter the threshold voltage of any memory cells on an unselected memory string. Boosting the channels of program inhibited memory strings helps to prevent program disturb.

At block 308, a program pulse (e.g., programming voltage) is applied to the selected word line while the channels of the program inhibited memory strings are boosted. Also, a "program enable" voltage may be applied to bit lines associated with memory strings having a memory cell to receive programming. By receiving programming, it meant that the memory cell should have its threshold voltage altered. For some architectures, the program inhibit voltage could be about 2.2V, but this could vary based on design. Bit lines associated with memory cells that are being programmed are kept at a program enable voltage. For some implementations, the program enable voltage could be about 0V, but this could vary based on design.

At block 310, a verification process is performed. At decision block 312, it is determined whether the threshold voltage of a memory cell was verified to be at the final target threshold voltage for that memory cell (the value representing the value to store in the memory cell). It may not be necessary to verify that every memory cell for a given state is at the appropriate threshold voltage. Error correction may be able to correct for some memory cells being below their target threshold voltage. Error correction may be able to correct for some memory cells being over-programmed, for example.

If verification passes, the programming process is completed successfully (status=pass) at block 314. If all of the memory cells are not all verified, then it is determined whether the program loop counter (PC) is less than a maximum value PC(MAX). The value PC(MAX) may for example fall between three and six in some implementations.

If the program counter (PC) is not less than the maximum count (decision block 316), then the program process has failed (block 318). If the program counter (PC) is less than a maximum value (e.g., 6), then the program counter (PC) is incremented by 1 and the programming voltage Vpgm is stepped up to the next value at block 320. In some embodiments, the boosting voltages are also stepped up at block 320. Subsequent to block 320, the process loops back to block 304 to prepare for and apply the next program pulse to the selected word line.

After the programming pass is completed, the data can be read from the memory cells using read reference voltages that lie within the programmed threshold voltage distributions of the memory cells. By testing whether the threshold voltage of a given memory cell is above or below one or more of the read reference voltages, the system can determine the stored value which is represented by the threshold voltage of a memory cell.

Figure 4:
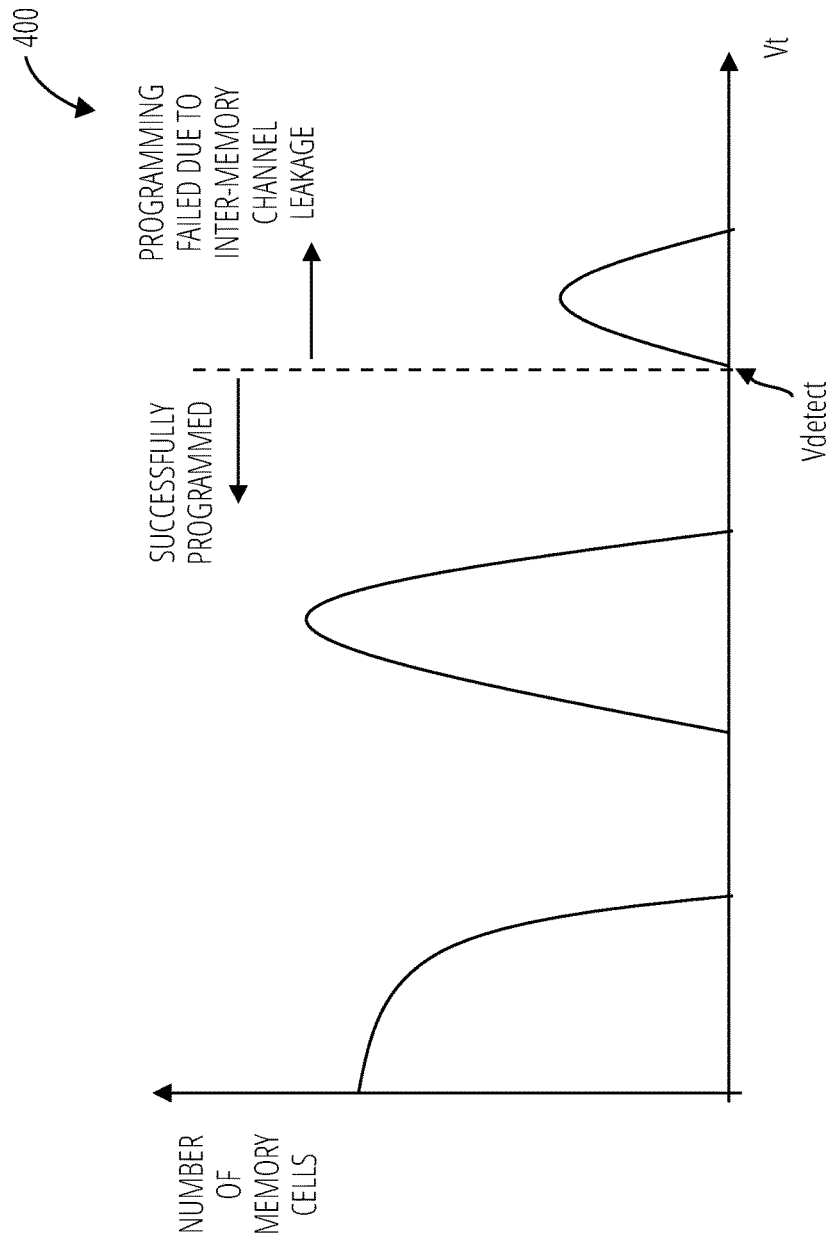
FIG. 4 illustrates a threshold voltage distributions 400 in accordance with one embodiment.

If the memory cell fails to program due to the inter-memory channel leakage effects described earlier, Vpgm will have reached its highest value and the threshold voltage on the memory cell will be higher than that of a normally-programmed memory cell. This will result in a distribution of threshold voltages on memory cells in a particular memory region (e.g., a FLASH memory block) for example as depicted in the threshold voltage distributions 400 of FIG. 4, where some number of memory cells have a threshold voltage higher than would be found on a successfully programmed memory cell.

A voltage on a selected word line that would cause successfully programmed memory cells to conduct current, by overcoming their threshold voltage, will not cause conduction by memory cells that failed to program due to inter-memory channel leakage, because the threshold voltage of these latter memory cells is higher than normal.

Figure 5:
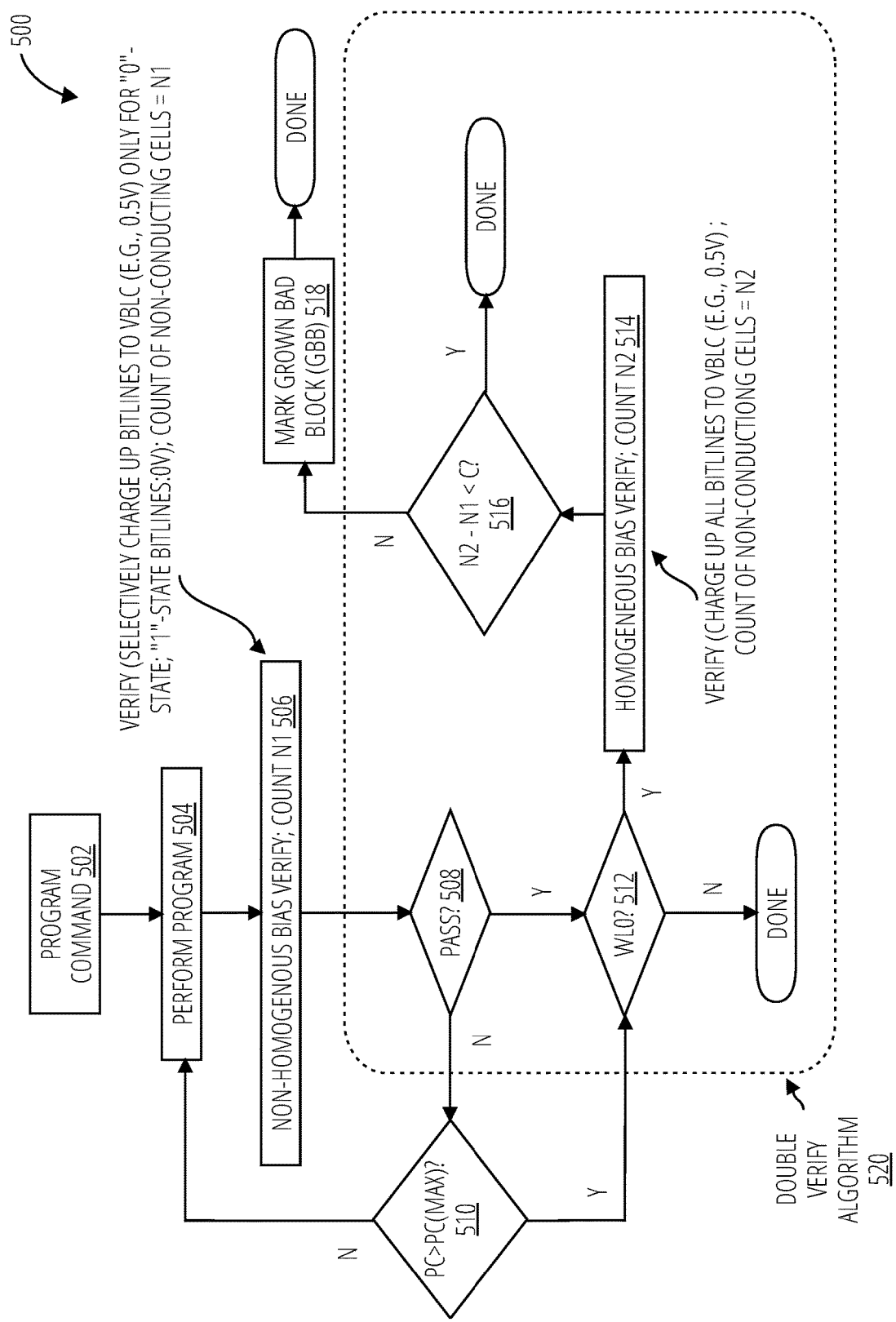
FIG. 5 illustrates a memory analysis process 500 in accordance with one embodiment.

FIG. 5 illustrates a memory analysis process 500 in one embodiment. The memory analysis process 500 may be carried out during lockout programming. A program command (block 502) initiates a memory program operation (block 504). A first program verify is performed (block 506). The first program verify is selective in the sense that only particular bitlines along the selected word line are charged to VBLC. For example, the only bitlines charged to VBLC are those programmed cells for which the data latch indicates the stored value in the memory cell along the selected word line. This creates a situation in which some adjacent memory channels have a potential gradient of around VBLC, as previously described. A count (N1) is made of bitlines which are non-conducting or otherwise respond in a particular way to this non-homogeneous bitline biasing.

If program verify fails (decision block 508) and the maximum program attempt count PC(MAX) is not exceeded (decision block 510), the program operation is re-attempted (block 504). PC(MAX) may be between three and six in some embodiments. If the program verify fails or the program count is exceeded, and if the selected word line is a particular word line (e.g., WL0, see decision block 512), then a second program verify is performed (block 514). This second program verify involves a homogeneous biasing of the bitlines along the selected word line, e.g., all bitlines are biased to VBLC. A count (N2) is made of non-conducting cells, or cells that respond in the same particular way as for the first verify, this time under homogeneous biasing. If (on condition that) the difference between these counts in less than a configured value (C) (decision block 516), the memory block is marked as "bad" and unavailable for use for storing data (block 518). A repair attempt may then be made on the memory block, and upon successful repair, the memory block may be marked "good" again and available for data storage.

The double verify algorithm 520 is triggered only when the selected word line is a particular word line (or one of a set of configured particular word lines). Therefore, in terms of average program performance, the overhead of the double verify algorithm 520 is likely acceptable. For example, if the detection verify is ~30 us, and there are 96 word lines in the memory block, thus is a average program performance penalty of 30 us/96 (total 96 WLs)=0.3 us, which may be considered negligible (<<1%).

Figure 7:
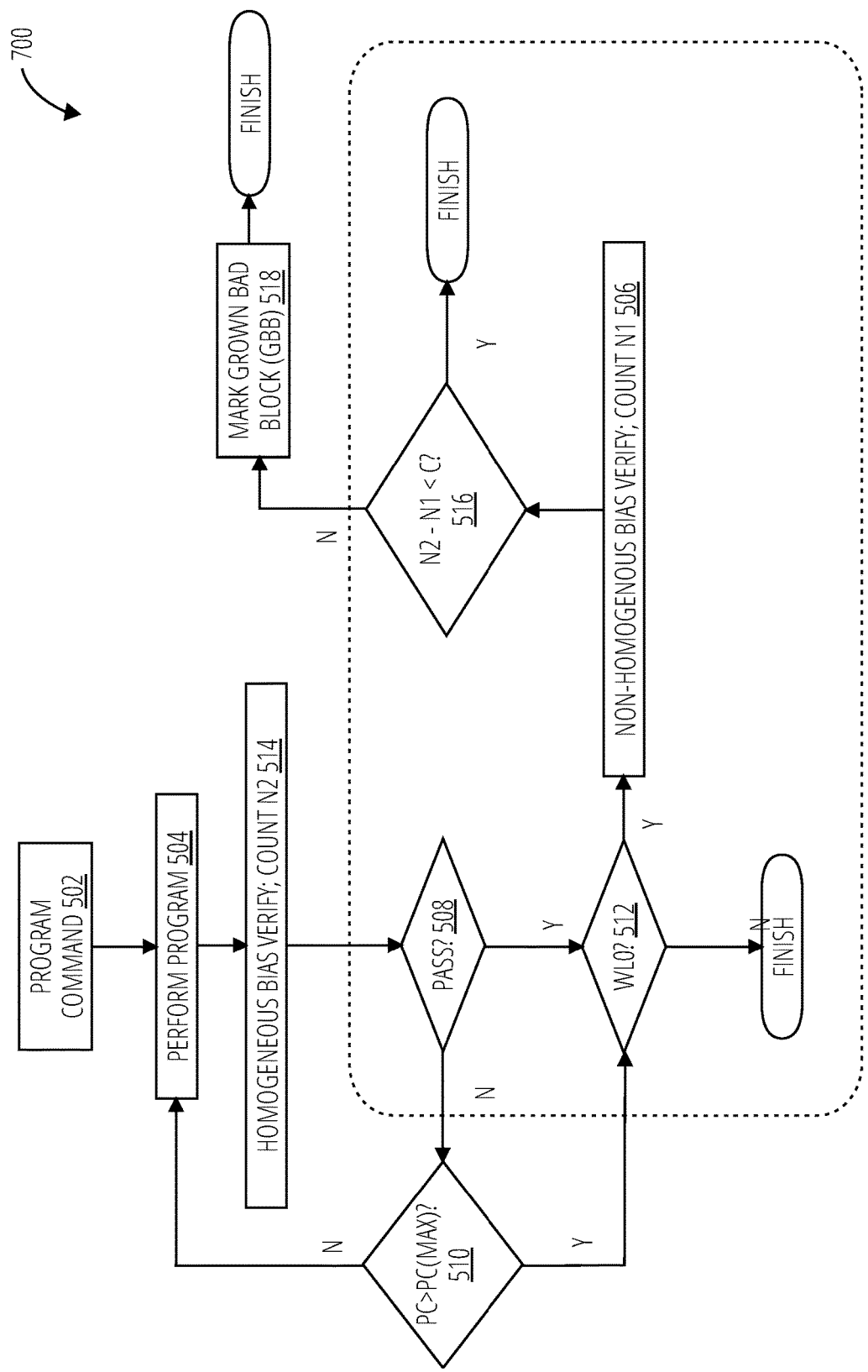
FIG. 7 illustrates a memory analysis process 700 in accordance with one embodiment.

The memory analysis process 500 may be useful for implementations utilizing lockout programming. In an alternate embodiment, instead of verifying the non-conducting cells, the erased-state, conducting cells may be counted for the verification. This alternative may be useful for implementations utilizing non-lockout programming. This alternative is depicted by the memory analysis process 700 of FIG. 7.

The second verify step may be scheduled or performed to occur every X block programs (where X is a configured value), not every time. The second verification may also run as a background management process. Verification may be improved used a random, 50/50 distribution of memory cell states. A random pattern of data may be written to memory blocks prior to performing verification, for example after manufacturing in order to test the memory before it enters the field. User data itself may present a sufficiently random pattern for verification throughout memory life. Verification in later memory life may be used to detect blocks that deteriorate over time (grown bad blocks).

Figure 6:
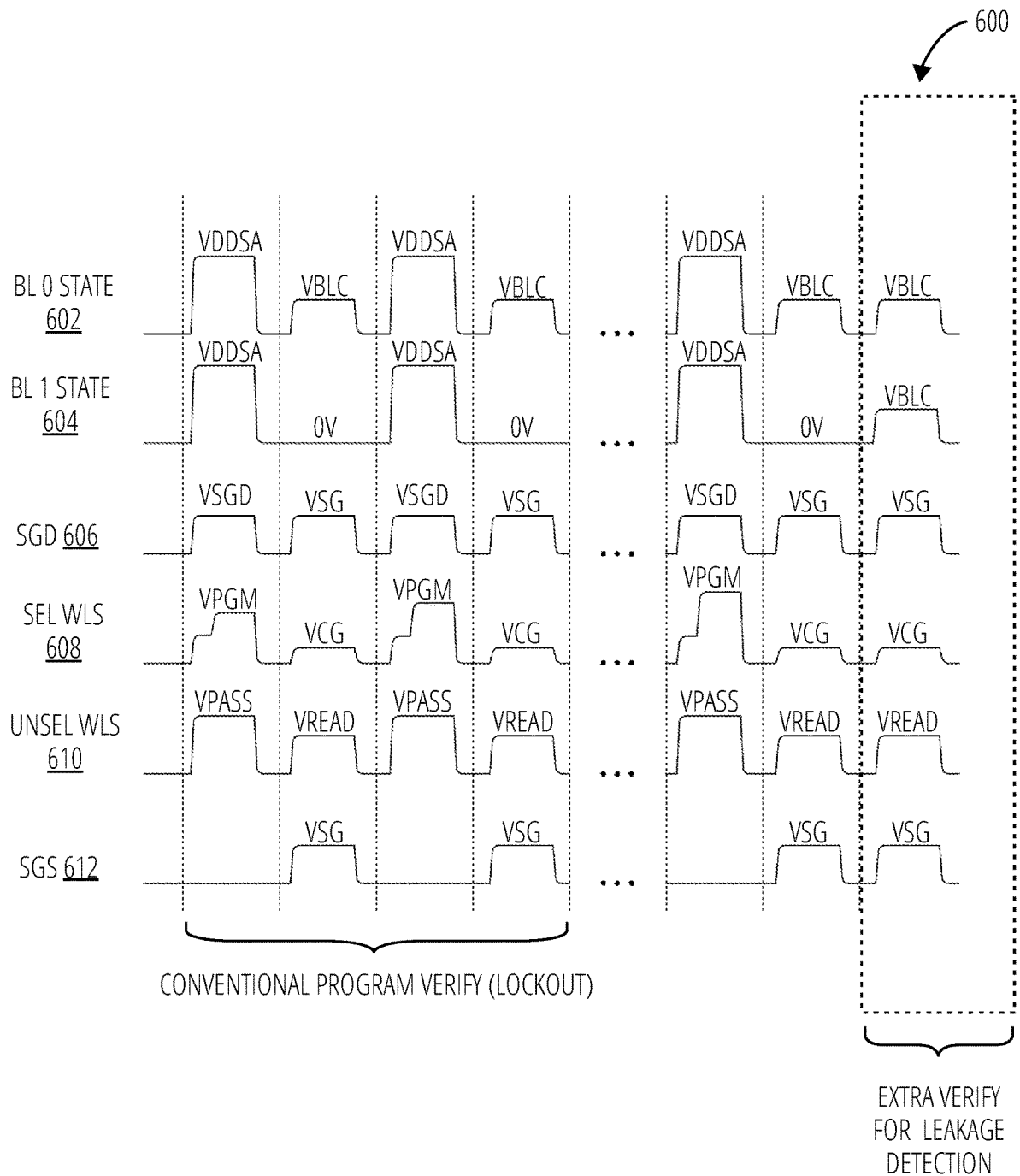
FIG. 6 illustrates a signal diagram 600 in accordance with one embodiment.
Figure 8:
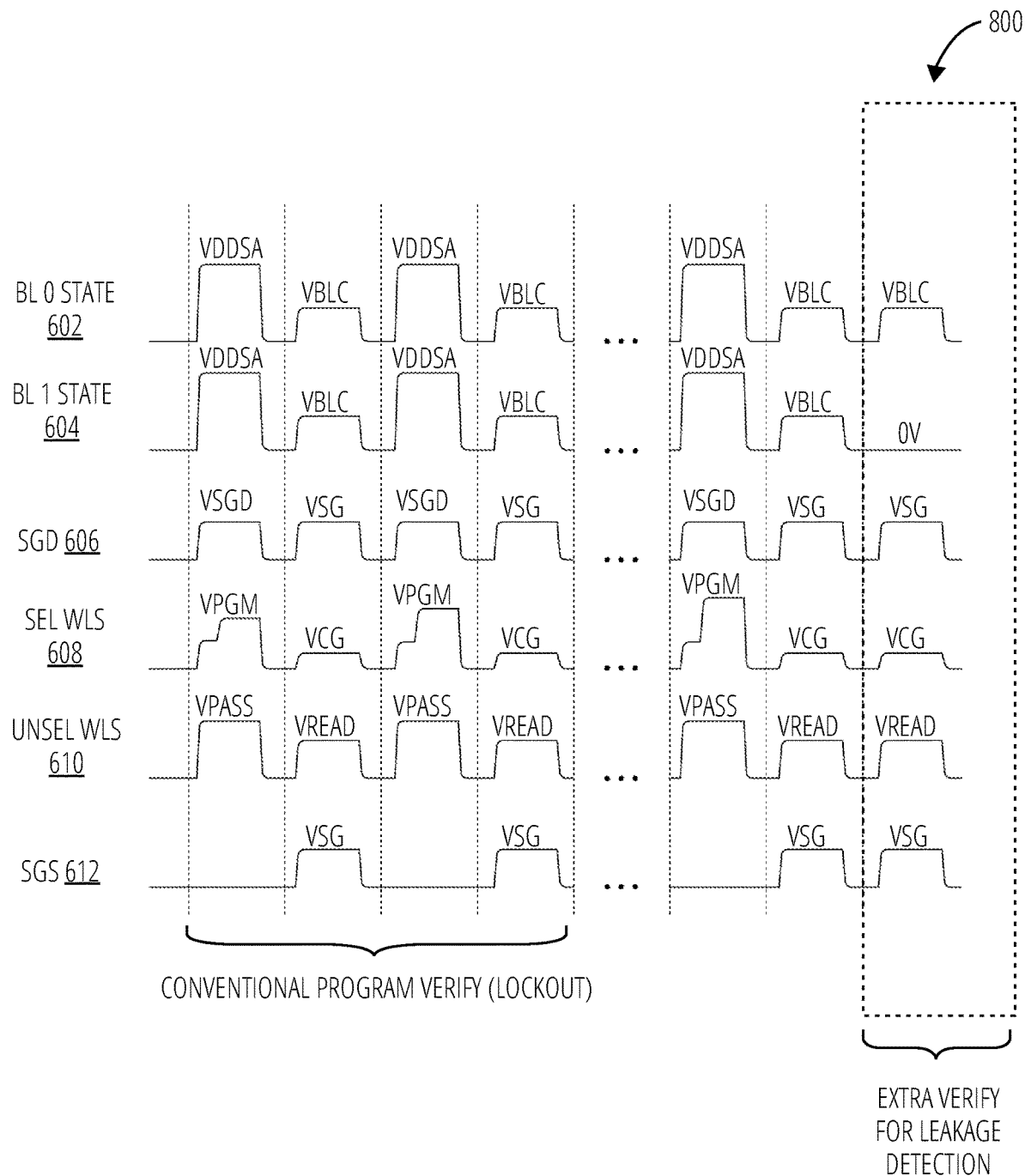
FIG. 8 illustrates a signal diagram 800 in accordance with one embodiment.

FIG. 6 depicts a signal diagram 600 for memory programming and analysis in a single-level-cell (SLC) memory. FIG. 8 depicts a signal diagram 800 for the alternative embodiment depicted in FIG. 7. The signals depicted includes signals for 0 state bitlines 602, 1 state bitlines 604, drain gate select 606, a selected word line 608, unselected word lines 610, and a source gate select 612. The names and purposes of the signals will be readily understood by those of ordinary skill in the art. Other signals may also be utilized to program the memory, as known in the art. Exemplary levels for the various signals, in one embodiment, are:

VDDSA: 2V-3V
VBLC: 0.2V-0.5V
VSG: 5-8V
VSGD (bias during VPGM pulse): 3V
VCG: 2V
VPASS: 8-10V
VREAD: 6-8V
VPRGM: may step up as high as 20V These voltages may vary according to the requirements of the implementation. The 0 state in this example represents memory cells that are programmed, and the 1 state represents erased memory cells.

Figure 9:
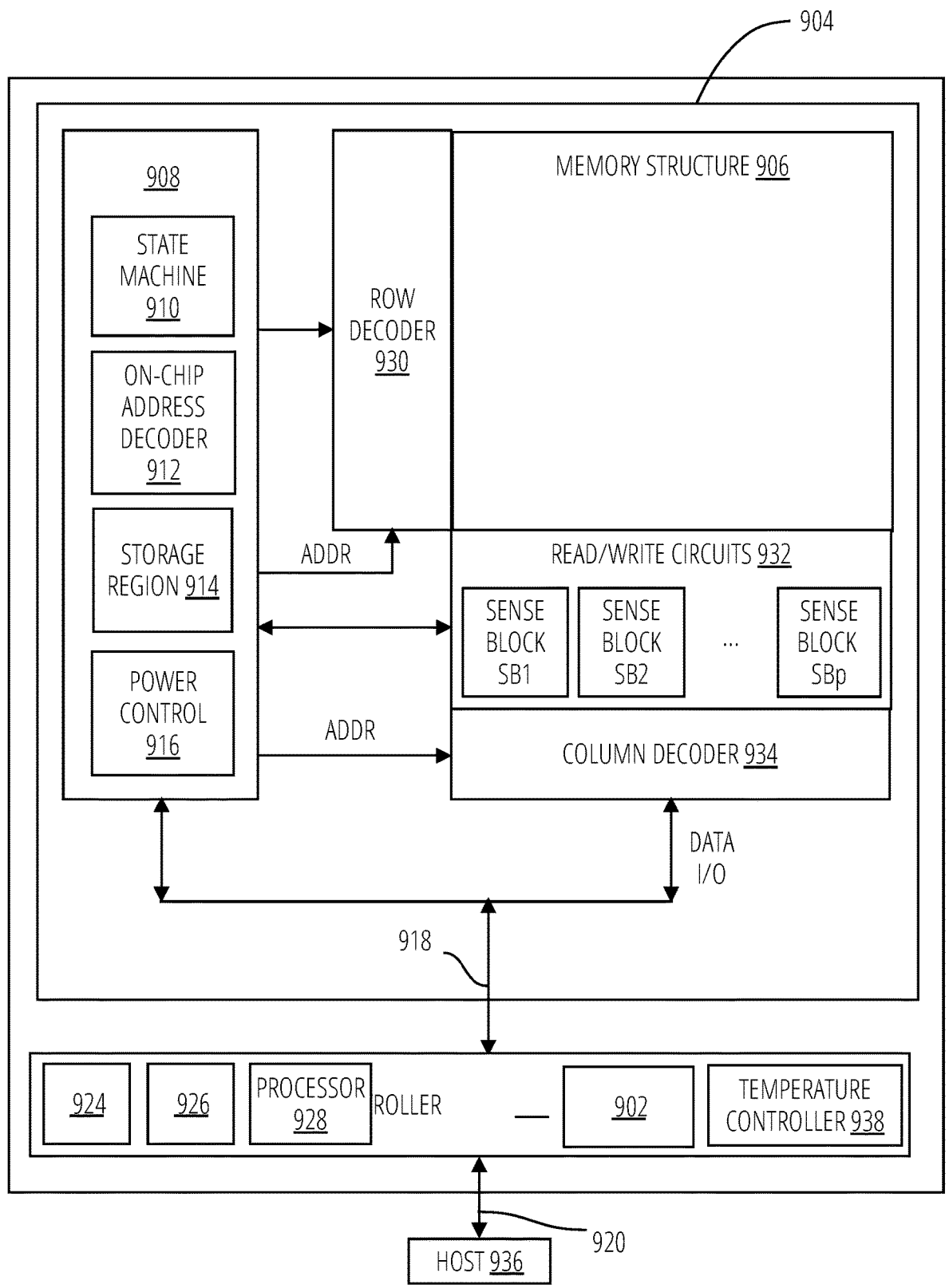
FIG. 9 is a block diagram of an example memory device in one embodiment.

FIG. 9 is a block diagram of an exemplary memory device. The memory device may include one or more memory die 904. The memory die 904 includes a memory structure 906 of memory cells, such as an array of memory cells herein referred to as a memory array, an address controller 908, and read/write circuits 932. The memory structure 906 is addressable by word lines via a row decoder 930 and by bit lines via a column decoder 934. The read/write circuits 932 include multiple sense blocks SB1, SB2, . . . , SBp (sensing circuitry) and allow a page of memory cells to be read or programmed in parallel. Typically a read/write controller 922 is included in the same memory device (e.g., a removable storage card) as the one or more memory die 904. Commands and data are transferred between the host device 936 and read/write controller 922 via a data bus 920, and between the controller and the one or more memory die 904 via lines 918.

The memory structure 906 can be 2D (laid out in a single fabrication plane) or 3D (laid out in multiple fabrication planes). The memory structure 906 may comprise one or more array of memory cells including a 3D array. In one embodiment, the memory structure 906 may comprise a monolithic three-dimensional memory structure (3D array) in which multiple memory levels are formed above (and not in) a single substrate, such as a wafer, with no intervening substrates. The memory structure 906 may comprise any type of non-volatile memory that is monolithically formed in one or more physical levels of arrays of memory cells having an active area disposed above a silicon substrate. The memory structure 906 may be in a non-volatile memory device having circuitry associated with the operation of the memory cells, whether the associated circuitry is above or within the substrate.

The address controller 908 cooperates with the read/write circuits 932 to perform memory operations on memory cells of the memory structure 906, and includes a state machine 910, an address decoder 912, a temperature controller 938, and a power control 916. The state machine 910 provides chip-level control of memory operations. A store region selector 914 may be provided, e.g., for programming parameters as described further below.

The address decoder 912 provides an address interface between that used by the host or a read/write controller 922 to the hardware address used by the row decoder 930 and column decoder 934. The power control 916 controls the power and voltages supplied to the various control lines during memory operations. The power control 916 and/or read/write circuits 932 can include drivers for word lines, source gate select (SGS) transistors, drain gate select (DGS) transistors, bit lines, substrates (in 2D memory structures), charge pumps, and source lines. The power control 916 can therefore include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than memory structure 906, can be thought of as at least one control circuit or controller which is configured to perform the techniques described herein. For example, a control circuit may include any one of, or a combination of, address controller 908, state machine 910, address decoder 912, column decoder 934, power control 916, control processor 928, error correction unit 902, sense blocks SB1, SB2, . . . , SBp, read/write circuits 932, read/write controller 922, and so forth.

The read/write controller 922 may comprise a control processor 928, memory devices (memory) such as controller read-only memory 924 and controller volatile memory 926, and other functional units known in the art.

The memory devices of the read/write controller 922 may comprise code such as a set of instructions, and the control processor 928 is operable to execute the set of instructions to provide aspects of the functionality described herein. Alternatively or additionally, the control processor 928 can access code from the memory structure 906, such as a reserved area of memory cells in one or more word lines.

For example, code can be used by the read/write controller 922 to access the memory structure 906 for programming (write), read, and reset operations. The code can include boot code and control code (e.g., set of instructions). The boot code is software that initializes the read/write controller 922 during a booting or startup process and enables the read/write controller 922 to access the memory structure 906. The code can be used by the read/write controller 922 to control one or more memory structures.

In one embodiment, upon being powered up, the control processor 928 fetches the boot code from the controller read-only memory 924 or memory structure 906 for execution, and the boot code initializes the system components and loads the control code into the controller volatile memory 926. Once the control code is loaded into the controller volatile memory 926, it is executed by the control processor 928. The control code includes drivers to perform basic tasks such as controlling and allocating memory, prioritizing the processing of instructions, and controlling input and output ports.

Generally, the control code can include instructions to configure one or more controller to perform the functions described herein. For example the control code can implement a sequencer to control the timing (start and stop times, durations, spacing etc.) of the various actions described herein.

In one embodiment, the host device 936 is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the read/write controller 922 to perform the methods described herein. The host may also include additional system memory, one or more input/output interfaces and/or one or more input/output devices in communication with the one or more processors, as well as other components well known in the art.

The store region selector 914 may be a non-volatile memory such as NAND flash memory, or another type, implementing a memory map or address translation table. Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A memory device comprising:
    a memory array; and
    a controller configured to:
        execute a non-homogeneous bitline biasing program verify operation on a plurality of bitlines of the memory array;
        generate a first count of a number of the bitlines having a particular response to the non-homogeneous bitline biasing program verify operation;
        execute a homogeneous bitline biasing program verify operation on the bitlines;
        generate a second count of a number of the bitlines having the particular response to the homogeneous bitline biasing program verify operation; and
        performing a memory management operation based on the first count and the second count.

2. The memory device of claim 1, wherein the controller is configured to first execute the non-homogeneous bitline biasing program verify operation, and then execute the homogeneous bitline biasing program verify operation.

3. The memory device of claim 1, wherein the controller is configured to first execute the homogeneous bitline biasing program verify operation, and then execute the non-homogeneous bitline biasing program verify operation.

4. The memory device of claim 1, wherein the controller is configured to execute the homogeneous bitline biasing program verify operation only for one particular word line.

5. The memory device of claim 4, wherein the one particular word line is word line 0.

6. The memory device of claim 1, wherein the non-homogeneous bitline biasing program verify operation biases bitlines for programmed memory cells to a non-zero-valued first voltage and biases bitlines for erased memory cells to a zero-valued second voltage.

7. The memory device of claim 6, wherein the homogeneous bitline biasing program verify biases both of the bitlines for erased memory cells and the bitlines for programmed memory cells to the non-zero-valued first voltage.

8. The memory device of claim 6, wherein the non-zero-valued first voltage is within the range of 0.2V-0.5V.

9. A controller configured to:
    execute a non-homogeneous bitline biasing program verify operation on a plurality of bitlines of a memory array;
    execute a homogeneous bitline biasing program verify operation on the bitlines; and
    compare a first count of a number of the bitlines having a particular response to the non-homogeneous bitline biasing program verify operation with a second count of a number of the bitlines having the particular response to the homogeneous bitline biasing program verify operation.

10. The controller of claim 9, the controller further configured to execute a memory management operation based on a result of comparing the first count and the second count.

11. The controller of claim 9, further configured to first execute the non-homogeneous bitline biasing program verify operation, and then execute the homogeneous bitline biasing program verify operation.

12. The controller of claim 9, further configured to first execute the homogeneous bitline biasing program verify operation, and then execute the non-homogeneous bitline biasing program verify operation.

13. The controller of claim 9, further configured to execute both of the homogeneous bitline biasing program verify operation and the non-homogeneous bitline biasing program verify operation only for one particular word line.

14. The controller of claim 13, wherein the one particular word line is word line 0.

15. The controller of claim 9, wherein the non-homogeneous bitline biasing program verify operation biases bitlines for programmed memory cells to a non-zero-valued first voltage and biases bitlines for erased memory cells to a zero-valued second voltage.

16. The controller of claim 15, wherein the homogeneous bitline biasing program verify biases both of the bitlines for erased memory cells and the bitlines for programmed memory cells to the non-zero-valued first voltage.

17. The controller of claim 15, wherein the non-zero-valued first voltage is within the range of 0.2V-0.5V.

18. An apparatus comprising:
    memory means;
    means for comparing (a) a first count of bitlines of the memory means providing a particular response to a non-homogeneous bitline biasing program verify operation, and (b) a second count of the bitlines responding to a homogeneous bitline biasing program verify operation; and
    means for performing a memory management operation based on the comparing.

19. The apparatus of claim 18, wherein the means for comparing operates only on one particular word line.

20. The apparatus of claim 19, wherein the one particular word line is word line 0.

* * * * *